(12) United States Patent
Townsend (10) Patent No.: US 7,594,059 B2
(45) Date of Patent: Sep. 22, 2009

(54) MULTI-INTERFACED ACCESSORY DEVICE FOR USE WITH HOST COMPUTING SYSTEMS (75) Inventor: Karl Townsend, Los Altos, CA (US)

(73) Assignee: Palm, Inc., Sunnyvale, CA (US)

( * ) Notice: Subject to any disclaimer, the term of this patent is extended or adjusted under 35 U.S.C. 154(b) by 136 days.

(21) Appl. No.: 11/681,722

(22) Filed: Mar. 2, 2007

(65) Prior Publication Data
US 2008/0140902 A1 Jun. 12, 2008

(51) Int. Cl.
G06F 13/00 (2006.01)
(52) U.S. Cl. .................................. 710/313; 711/115
(58) Field of Classification Search .................. 710/8, 710/12–14, 62, 64, 74, 104, 306, 313, 316; 711/115
See application file for complete search history.

(56) References Cited

U.S. PATENT DOCUMENTS

| 3,744,034 | A | 7/1973 | Paul |
| 4,860,372 | A | 8/1989 | Kuzunuki et al. |
| 4,972,496 | A | 11/1990 | Sklarew |
| 5,231,381 | A | 7/1993 | Duwaer |
| 5,305,394 | A | 4/1994 | Tanaka |
| 5,332,993 | A | 7/1994 | Ninomiya |
| 5,349,668 | A | 9/1994 | Gladstein et al. |
| 5,386,567 | A | 1/1995 | Lien et al. |
| 5,389,745 | A | 2/1995 | Sakamoto |
| 5,434,929 | A | 7/1995 | Beernink et al. |
| 5,442,794 | A | 8/1995 | Wisor et al. |
| 5,444,192 | A | 8/1995 | Shetye et al. |
| 5,452,371 | A | 9/1995 | Bozinovic et al. |
| 5,463,261 | A | 10/1995 | Skarda et al. |
| 5,463,742 | A | 10/1995 | Kobayashi |
| 5,504,908 | A | 4/1996 | Ikeda |
| 5,528,743 | A | 6/1996 | Tou et al. |
| 5,534,892 | A | 7/1996 | Tagawa |
| 5,557,738 | A | 9/1996 | Townsley et al. |
| 5,581,772 | A | 12/1996 | Nanno et al. |
| 5,613,135 | A | 3/1997 | Sakai et al. |
| 5,615,284 | A | 3/1997 | Rhyne et al. |
| 5,621,817 | A | 4/1997 | Bozinovic et al. |
| 5,630,148 | A | 5/1997 | Norris |
| 5,648,762 | A | 7/1997 | Ichimura et al. |

(Continued)

FOREIGN PATENT DOCUMENTS

EP 0560510 A1 9/1993

(Continued)

OTHER PUBLICATIONS

Ed Nisley, "Two-Way Power Line Communication", Mar. 1992, The Computer Applications Journal, pp. 74-76,78-81.

(Continued)

Primary Examiner—Glenn A Auve
(74) Attorney, Agent, or Firm—Mahamedi Paradice Kreisman LLP (57) ABSTRACT A device includes two connectors for enabling connectivity and access of a data resource by a connected computer or computing system. Each connector may support a different communication port, and the device may include circuitry and/or other logic to support a data exchange protocol used with either kind of communication port. This allows the device to be used with multiple kinds of computing devices.

22 Claims, 4 Drawing Sheets

U.S. PATENT DOCUMENTS

| | | | |
|---|---|---|---|
| 5,652,891 A | 7/1997 | Kitamura et al. | |
| 5,666,256 A | 9/1997 | Zavis et al. | |
| 5,673,357 A | 9/1997 | Shima | |
| 5,698,822 A | 12/1997 | Haneda et al. | |
| 5,710,931 A | 1/1998 | Nakamura et al. | |
| 5,717,936 A | 2/1998 | Uskali | |
| 5,754,436 A | 5/1998 | Walsh et al. | |
| 5,758,099 A | 5/1998 | Grieco et al. | |
| 5,781,744 A | 7/1998 | Johnson et al. | |
| 5,783,926 A | 7/1998 | Moon et al. | |
| 5,784,295 A | 7/1998 | Hinohara | |
| 5,832,286 A | 11/1998 | Yoshida | |
| 5,841,901 A | 11/1998 | Arai et al. | |
| 5,859,522 A | 1/1999 | Theobald | |
| 5,859,970 A | 1/1999 | Pleso | |
| 5,946,392 A | 8/1999 | Tague | |
| 5,948,077 A | 9/1999 | Choi et al. | |
| 6,038,457 A | 3/2000 | Barkat | |
| 6,069,960 A | 5/2000 | Mizukami et al. | |
| 6,073,201 A | 6/2000 | Jolley et al. | |
| 6,334,160 B1 | 12/2001 | Emmert et al. | |
| 6,359,987 B1 | 3/2002 | Tran et al. | |
| 6,457,134 B1 | 9/2002 | Lemke et al. | |
| 6,523,124 B1 | 2/2003 | Lunsford et al. | |
| 6,594,366 B1 | 7/2003 | Adams | |
| 6,665,803 B2 | 12/2003 | Lunsford et al. | |
| 6,988,905 B2 | 1/2006 | Corey et al. | |
| 7,103,381 B1 | 9/2006 | Wright et al. | |
| 7,152,190 B2 * | 12/2006 | Overtoom | 714/44 |
| 7,296,098 B2 * | 11/2007 | Shih | 710/13 |
| 7,329,136 B2 * | 2/2008 | Su et al. | 439/172 |
| 7,330,215 B2 | 2/2008 | Ito | |
| 7,340,284 B2 | 3/2008 | Chung | |
| 2002/0091953 A1 | 7/2002 | Min | |
| 2003/0232648 A1 | 12/2003 | Prindle | |
| 2004/0019732 A1 * | 1/2004 | Overtoom et al. | 710/313 |
| 2004/0032394 A1 | 2/2004 | Ayatsuka et al. | |
| 2005/0060490 A1 * | 3/2005 | Lu | 711/115 |
| 2005/0078935 A1 | 4/2005 | Sun | |
| 2006/0033809 A1 * | 2/2006 | Farley | 348/14.01 |
| 2006/0047982 A1 * | 3/2006 | Lo et al. | 713/300 |
| 2006/0068910 A1 | 3/2006 | Schmidt et al. | |
| 2008/0071963 A1 * | 3/2008 | Chow et al. | 710/313 |

FOREIGN PATENT DOCUMENTS

| | | |
|---|---|---|
| EP | 0861008 A1 | 8/1998 |
| WO | WO 2007/135522 A2 * | 11/2007 |

OTHER PUBLICATIONS

On-The-Go Supplemental to the USB 2.0 Specification, USB Implementers Forum, Inc. (USB-IF), 81 pages, dated Apr. 4, 2006.
USB 2.0 Specification, 650 pages, dated Apr. 27, 2000.
USB 2.0 Specification Engineering Change Notice (ECN) #1: Mini-B connector, 45 pages, dated Oct. 20, 2000.

* cited by examiner

MULTI-INTERFACED ACCESSORY DEVICE FOR USE WITH HOST COMPUTING SYSTEMS

TECHNICAL FIELD

The disclosed embodiments relate generally to the field of connectivity. In particular, the disclosed embodiments relate to a multi-interfaced accessory device for use with host computing systems.

BACKGROUND

The Universal Serial Bus (USB) is a connector standard that is in wide use. Currently, numerous standard bodies exist (USB 2.0) for enumerating requirements for implementation with USB connectors, including requirements for performance, hardware, form factor and various data transfer and connectivity protocols. As the USB connector becomes more popular and widespread, more applications and standards are adopted for the USB. In particular, there has been an effort to adopt standards by which the form factor of the USB becomes smaller, and has use in a variety of applications and environments in order to accommodate increasingly mobile and new computing devices.

As the name indicates, the USB connector acts as a data bus. In a standard mode of operation, the user is able to connect numerous devices to a single port using hubs. When devices are connected to a host, the host acts as a controller for all USB communications that enter through a particular port.

In general, the USB connector has a physical layer that includes hardware for implementing the data transfer protocol by which data is passed through the USB connector. The physical layer performs several functions, including serialization and de-serialization of transmissions, encoding and decoding of the signals. Across the USB connector, the protocol implemented provides for data packets that include token, data, and handshake packets.

Numerous standards have been and are currently being developed for the USB. These standards accommodate new smaller form factors, such as Mini or Micro-USB, as well as new data transfer protocols (e.g. USB 2.0). There is also a new standard for wireless USB ports. In addition, new standards accommodate use of USB connectors in various environments and applications. One standard is provided with "On-the-Go" which enables two devices connected through a USB port to negotiate for the role of the host. In particular, the On-The-Go Standard has introduced a Host Negotiation Protocol for enabling one device to act as host and controller in a one-to-one pairing.

Another more specific standard is the CEA-936A standard, which provides for use of USB connectors (Mini or Micro) in the context of "car kits". In this context, a mobile computing device, or even a vehicle component, can utilize accessory devices such as stereo headsets and car chargers. Among other functionality, the CEA-936A standard provides for the host to have the ability to detect the particular type or kind of device connected to it, using signal line characteristics that are caused by the coupling of the particular device.

DETAILED DESCRIPTION

One or more embodiments described herein include a multi-interfaced accessory device for use with computing systems that can act as hosts. In one embodiment, a device includes two connectors for enabling connectivity and access of a data resource by a connected computer or computing system. Each connector may support a different communication port, and the device may include circuitry and/or other logic to support a data exchange protocol used with either kind of communication port. This allows the device to be used with multiple kinds of computing devices.

As used herein, the term "logic" means a sequence of operations or functions performed by hardware, software, firmware or combinations thereof. Hardware logic is made up of circuits that perform an operation. Software logic is the sequence of instructions in a program.

Numerous types of computing devices may be used with embodiments described herein. One type of computing device that may be employed with one or more embodiments include mobile or portable computing devices, including wireless devices for use in messaging and telephony applications using cellular networks. Such devices are sometimes called "smart phones", "hybrid devices" or "multi-function devices". Mobile computing devices are generally small enough to fit in one hand, but provide cellular telephony features in combination with other applications. Examples of such other applications include contact applications for managing contact records, calendar applications for managing and scheduling events, task applications for keeping lists, and camera applications for capturing images. Additionally, many types of messaging transports may be provided on such mobile computing devices, including SMS, MMS, email and instant messaging.

Other examples of mobile computing devices contemplated for use with one or more embodiments described herein include portable media players, global positioning system devices, personal digital assistants, portable gaming machines, and/or devices that combine functionality of such devices. In addition, at least some embodiments described herein are applicable to desktop computers, laptops, and computer appliances (e.g. set-top boxes). A typical environment on which one or more embodiments may be implemented include a wireless or cellular device capable of both telephony and messaging or data transfer. Another environment on which one or more embodiments may be implemented include work stations or server modules, including server modules with functionality such as servers with software that automatically, programmatically or otherwise push data onto a device such as described.

One or more embodiments described herein provide that methods, techniques and actions performed by a computing device are performed programmatically, or as a computer-implemented method. Programmatically means through the use of code, or computer-executable instructions. A programmatically performed step may or may not be automatic.

Unless stated otherwise, all reference made to the USB Standard should be assumed to mean the USB 2.0 standard and/or one of its Supplements. Any reference made to the USB 2.0 standard refers to the Specification adopted by the USB Implementation Forum in 2001, and released in April 2000. For purpose of defining various aspects of the USB standard (not just USB 2.0), the USB 2.0 Standard, as released in April 2000 and revised in December 2002 is hereby incorporated by reference. Moreover, the USB On-The-Go Supplement 1.2, as released in April 2006, is also incorporated by reference. While numerous embodiments make reference or incorporate aspects of the USB standard, other embodiments may extend to devices and connectivity systems that are not part of the USB standard, such as devices that incorporate non-standard proprietary connectors.

Overview

In an embodiment, an accessory device is configured to support different communication ports and data exchange protocols by structuring at least one of the connectors, or a data bus or signal line extending therefrom, to provide an assumed or designated signal or value to a connecting computing system. This assumed or designated value/signal communicates information to the connecting computing system about the device, while at the same time enabling the same internal circuitry and/or device logic to be used with computing systems connected to either connector.

In one embodiment, a device is configured to support two USB connectors. Under one implementation, one connector is a USB Type A connector plug, and another connector is a USB Type A/B connector plug. In one implementation, the latter plug connector may have a smaller form factor, such as described with Mini-USB specifications, or anticipated with so-called Micro-USB specifications.

Additionally, one or more embodiments provide the device with a switching mechanism that can be triggered by a user. When triggered, the device can send a signal to the connected computing system. One result that may be achieved is that a function that was associated or invoked by the connected computing system for use with the device may be alternated or switched to another function.

In an embodiment, an electronic device is provided for use with a computing system. The device includes a housing, a first connector, a second connector, a data resource and an integrated circuit component. The first connector may have a first form factor and be matable with a first type of communication port. Additionally, the first connector may includes a first set of contact elements. The second connector may have a second form factor, and be matable with a second type of communication port. Additionally, the second connector may include a second set of contact elements. The housing may contain a data resource for use by a connected computing system. A plurality of signal lines extend from each of the first and second set of contact elements to the integrated circuit component, where first and second set of contact elements share at least some of the plurality of signal lines that connect to the integrated circuit component. The integrated circuit component is configured to enable (i) a first computing system having the first communication port to access and use the data resource through the first connector and at least a first portion of the plurality of signal lines, and (ii) a second computing system having the second communication port to access and use the data resource through the second connector and at least a second portion of the plurality of signal lines.

One or more embodiments may also be implemented on a system that comprises a computer (or computing system) and a device such as described.

Detailed Overview

Figure 1:
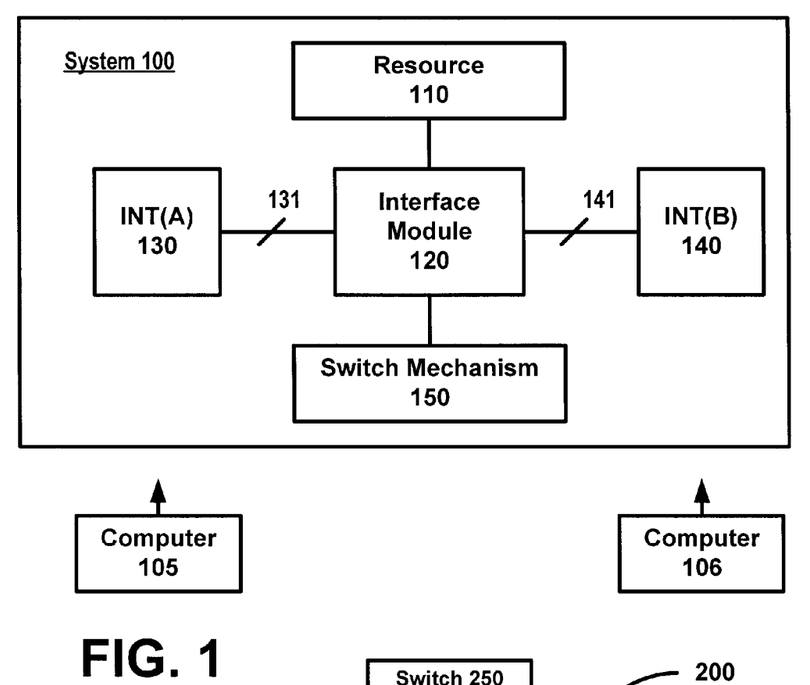
FIG. 1 is a block diagram describing components of a multi-interfaced accessory device, according to an embodiment of the invention.

FIG. 1 is a block diagram describing components of a multi-interfaced accessory device, according to an embodiment of the invention. As described, a device 100 includes a resource 110 that can used by a given computer 105, 106 that connects to the device 100. The device 100 includes two or more physical interfaces for accommodating different kinds of communication ports on whichever of the computers 105, 106 is connected (in some embodiments, computers 105, 106 means computer 105 or computer 106). In particular, device 100 may include a first physical interface 130 and a second physical interface 140. An interface module 120 is connected to each of the first or second physical interface 130, 140 to enable the connected computer to access the resource 100. In one embodiment, the resource 110 corresponds to a data resource, such as a memory component. Other implementations may provide for resource 110 to correspond to a device or component that provides additional functionality, such as a wireless modem device.

According to embodiments described herein, the serial bus connection is a USB type connection. As a USB connection, one or more embodiments assume a serial line and component configuration similar to an embodiment described with FIG. 3. Furthermore, one or more embodiments provide that the USB connection satisfies many of the requirements for use as small form-factor connectors (e.g. Mini or Micro-USB), or with mobile and/or mobile environments (e.g. On-The-Go, CEA-936A). Other embodiments may apply to other forms of serial bus connections, such as, for example, serial bus connections that are compliant with the IEEE 1394 (so called "Firewire") standards.

According to an embodiment, each of the first and second physical interfaces 130, 140 may correspond to plug connectors. In one embodiment, the first interface 130 and the second interface 140 each include a type of plug connector that extends a data bus 131, 141 to the interface module 120. The interface module 120 includes logic to support the connected computer in accessing the resource 110 through one of the first interface 130 and data bus 131, or the second interface 140 and data bus 141. The connected computer 105, 106 may include logic in the form of software, hardware or firmware, to use and access the resource 110 through one of the physical interfaces 130, 140 and the interface module 120. To this end, one or more embodiments provides that the logic of the interface module 120 may correspond to circuitry and hardware that supports a data exchange protocol that is executed or hosted by the connected computer 105, 106.

While computers 105, 106 may be of different types, an embodiment provides that only one of the computers connects to the device 100 at any one time ("connected computer"). The connected computer includes one or more types of communication ports, of which at least one communication port is configured to be mated with either the first physical interface 130 or the second physical interface 140. In this way, each interface 130, 140 may be configured in form-factor, dimension and pin alignment for a particular type of communication port. The presence of two different interfaces 130, 140 enables the device 100 to accommodate two or more kinds of communication ports. The type of communication ports that the device 100 may communicate with may differ in form factor, layout, and/or accompanying logic. Moreover, the types of communication ports that the device 100 may accommodate may be of kinds that are generally provided on different kinds of computing devices (e.g. desktop computer versus portable computing device). Thus, computers 105, 106 may be representative of different kinds of computing systems that can connect and use the device 100.

In an embodiment, device 100 is configured to be a client when sharing or enabling use of the resource 110 by the connected computer 105, 106. One or more embodiments provide that the communication port that connects to the first interface 130 requires the connected computer 105, 106 to be a host only, while the communication port that connects to the second interface 140 enables the connected computer 105, 106 to be either a host or a client. While device 100 may itself only be used a client, the ability of device 100 to accommodate communication ports that can be both "host only" and "host or client" enables the device 100 to connect and share resource 110 with different kinds of computers. For example, one of the computers 105, 106 may be a portable device such as a mobile phone device or personal digital assistant (PDA) that uses a type of communication port that enables that computer to be either host or client. For the case when computer 105 is of such type, the computer 105 may connect to the first physical interface 130, which may be configured for that particular kind of communication port. According to an embodiment, another of the computers 106 may alternatively be a desktop computer or other fully functioning device that has a communication port that requires use of the computer as "host only". For the case when computer 106 is of such type, the computer 106 may use the second physical interface 140, which may be configured for that particular kind of communication port.

For simplicity, descriptions provided herein assume that the connected computer may correspond to either computer 105 connecting to the first physical interface 130 or computer 106 connecting to the second physical interface 140. However, more than one type of computer may connect to each of the physical interfaces 130, 140, and moreover, it may also be possible for one type of computer to have communication ports for use with both interfaces.

In an embodiment, device 100 has a single interface module 120 for both physical interfaces 130, 140. In one embodiment, the interface module 120 may be configured with circuitry and/or other logic to support a communication or data exchange protocol that is used by the connected computer 105, 106, which acts as a host to the device 100. For example, each of the interfaces 130, 140 may be dimensioned, structured and configured with pin layout to accommodate a particular kind of communication port. The interface module 120 may combine with each interface 130, 140 (including connectivity elements between the interface module 120 and each interface) to support the protocol used by the communication port of computer 105, 106 for accessing and using the resource 110. In this way, the interface module 120 and the first physical interface 130 may combine to provide a first communication or data exchange channel between the resource 110 and a first type of communication port on computer 105. Likewise, the interface module 120 and the second physical interface 140 may combine to provide a second communication or data exchange channel between the resource 110 and a second kind of communication port on computer 106.

The interface module 120 may be configured or otherwise structured so that the communication channels formed through each of the interfaces 130, 140 support the protocol of the kind of communication port provided on the connected computer 105, 106. In one embodiment, one of the interfaces 130, 140 and/or its corresponding bus 131, 141 is structured physically, relative to the interface module 120, to appear as being the same in kind as the other interface or its corresponding bus 131. For example, the first physical interface 130 and/or its data bus 131 (which is assumed to connect to a small-form factor device) is structured to appear the same as the second physical interface 140 and/or its data bus 141.

Still further, under one embodiment, a portion (i.e. a pin or contact element) of the bus 131 of the first physical interface 130 is tied, grounded, floated or otherwise precluded from providing an independent signal path to the interface module 120. Any data that may be lost as a result of the structuring or configuring of the bus 131 is assumed by the interface 120 or the connected computer 105. In one embodiment, for example, one signal path in the bus 131 of the first interface 130 is terminated or otherwise modified (e.g. combined with another signal path), when this signal path would otherwise be used to identify information about the device 100 to the computer 105. In such an embodiment, the merged signal path is maintained at a state in which the connected computer 105 identifies the device 100 as a client. The connected computer 105 may include logic to identify the device 100 as a client, and to act as a host when implementing a protocol for accessing or using the resource 110. While such an implementation may assume the bus 141 from the second physical interface 140 is treated by the interface module 120 to be the same as the bus 131 from first physical interface 130, other embodiments may configure connectivity between one or both interfaces and the interface module 120 with other assumptions or designated values or settings, so that connectivity through either physical interface 130, 140 requires the same or common logic from the interface module 120.

Numerous alternatives for enabling communication channels between each of the physical interfaces 130, 140 and the resource 110 are possible. Under one embodiment, for example, the interface module 120 includes separate components and/or logic to support or implement different protocols (and/or communication ports) for accessing the resource 110. For example, interface module 120 may include a separate integrated circuit package for each of the first and second physical interfaces 130, 140.

Alternatively, the interface module 120 may support or implement a common portion of a data exchange protocol used by a communication port connected with one of the interfaces 130, while the protocol used with the communication port connected to the other interface 140 incorporates variations or additions to the underling protocol. The interface module 120 may be structured or configured with circuitry and/or other logic to implement the variations or additions used by the communication port connected to one or both of the interfaces 130, 140. In this way, each of the communication or data exchange channels provided by the device 100 support a corresponding kind, type or class of communication port on a given host computer system. This enables the device 100 to be versatile as to the type of host computer system that it can be used with, as different types of computing devices often use different types of communication ports.

In an embodiment, the device 100 provides Universal Serial Bus (USB) connectivity, and each of the physical interfaces 130, 140 are a particular type of USB plug connector. More specifically, under such an embodiment, the first and second physical interfaces 130, 140 may correspond to Series A and Series A/B plug connector, respectively. Under the USB standard, the interface module 120 includes an integrated circuit component provided on a fabricated semiconductor element (i.e. a "chip"), configured to support or implement the USB standard. This component is sometimes referred to as the "USB PHY" or "USB Physical Interface".

The device 100 is configured to communicate data to the connected computer 105, 106 through either the first physical interface 130 or second physical interface 140, where the data enables the connected computer to recognize the device 100 as having a particular function and/or being of a particular class. This function may correspond to the device's default or primary function. According to one or more embodiments, the device 100 is configured to signal the connected computer 105, 106, through either one or both physical interfaces 130, 140, an alternative identification or function enumeration. This alternative identification may cause the connected computer 105, 106 to invoke or otherwise associate a different function with the device 100. The connected computer 105, 106 may be configured to programmatically and/or automatically execute one or more processes assigned to either functionality or enumeration provided from the device 100.

In one embodiment, a switch mechanism 150 may be positioned to enable actuation by a user. When actuated, the switch mechanism 150 may cause device 100 to generate and communicate an interrupt signal, or alternatively, a high priority data communication, to the connected computer 105, 106. The switch mechanism 150 may correspond to a mechanical or electromechanical switch. For example, a user may press a button (e.g. See FIG. 4), pull a knob or operate another mechanical user-interface feature that switches the mode of operation or use associated with the device 100. When the signal is received by the connected computer 105, 106, software and/or other logic on that computer may identify and respond to the alternative enumeration or identification from the device 100. This response may include identifying the alternative functionality of the device 100, and performing processes or steps automatically or programmatically in response to making the identification. In one embodiment, the connected computer 105, 106 may have a default functionality assigned to the data source 110, and upon receiving the interrupt (or high priority communication), assign a new functionality for use with the data source 110. For example, resource 110 may correspond to a memory device comprising a controller and memory component. In a default mode, the connected computer 105, 106 may access and use the memory as an auxiliary storage unit (e.g. Flash Drive). If the switching component 150 is actuated, the device may be recognized and/or used as a backup drive or synchronization folder. Software on the connected computer 105, 106 may respond to the interrupt or high priority data by performing processes related to the alternative function.

Figure 2:
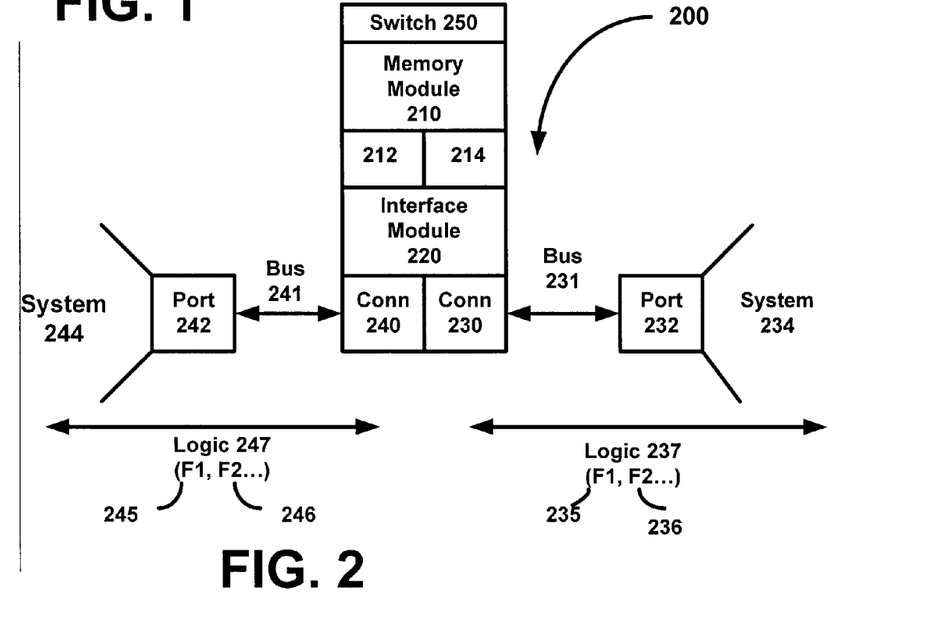
FIG. 2 is a block diagram describing a multi-interfaced device for use with different computing systems, according to another embodiment of the invention.

FIG. 2 is a block diagram describing a multi-interfaced device for use with different computing systems, according to another embodiment of the invention. In an embodiment, a device 200 includes a memory module 210, an interface module 220, a first connector 230, a second connector 240, and a user-interactive switch mechanism 250. The memory module 210 includes a memory controller 212 and a memory resource 214. The first connector 230 is configured to mate with a first communication port 232 on a corresponding computing system 234. Likewise, the second connector 240 is configured to mate with a second communication port 242 on a corresponding computing system 244. Each of the computing systems 234, 244 may include a processor, memory resources, and execute operating systems, applications and drivers for using the device 200.

In one embodiment, only one of the first connector 230 or second connector 240 can be mated with a corresponding communication port at any one time. The first connector 230 connects the first communication port 232 to the interface module 220 using a first data bus 231. The second connector 240 connects the second communication port 242 to the interface module 220 using a second data bus 241. According to an embodiment, portions of the first data bus 231 and second data bus 241 are shared.

The communication port 232, 242 on each corresponding computing system 234, 244 may include a connector or other physical interface that is shaped and structured to receive the corresponding first or second connector 230, 240. Each communication port 232, 242 may include or otherwise be associated with a driver and/or interface logic (in the form of programming or instructions executable by the processor of that computing device). Each computing system 234, 244 may implement one or more data exchange protocols through the logic included or associated with each communication port 232, 242. The connector or interface of each communication port 232, 242 may be structured for the particular protocols that are to be used with that communication port.

For example, as USB ports, logic associated or provided with computer systems 234, 244 carrying the communication ports 232, 242 may include an Extended Host Controller Interface, and one or more associated drivers. Additionally, each communication port 232, 242 may include a receptacle connector with a 4 or 5 pin layout in conformance with the USB 2.0 standard. Each computing system 234, 244 may also associate other programming or logic with the corresponding communication port 232, 242, such as one or more applications that execute automatically to implement a function of a particular device connected to the communication port.

In one implementation, the computing system 234, 244 on which the communication port 232, 242 resides may use the driver and associated logic to implement a data exchange protocol, such as a USB 2.0 protocol, when a compatible device is connected to the communication port. The device 200 supports the protocol implemented through each communication port 232, 242 by (i) having each connector 230, 240 structured and configured to mate with the corresponding communication port 232, 242, (ii) providing whichever of the first or second data bus 231, 241 that is in use to create the necessary signal paths required by the protocol being implemented, and (iii) configuring or structuring the interface module 220 to enable the connected computing system 234, 244 to access and use the memory module 210 as a host (with device 200 being a client). In one embodiment, the interface module 220 provides a physical interface between the memory controller 212 and the data bus 231, 241 that is in use.

Similar to an embodiment of FIG. 1, one or more embodiments provide that the interface module 220 is structured to support the data exchange protocol implemented by both the first computing system 234 (via the communication port 232) and the second computing system 244 (via the communication port 242). The data exchange protocol implemented by the first computing system 234 through the first communication port 232 may be different than the data exchange protocol implemented through the communication port 242. In one embodiment, the data exchange protocol used by the first communication port 232 is a variation of the protocol used by the second communication port 242. In such an embodiment, the device 200 may accommodate each communication port 232, 242 having or using a different number of signal lines. For example, under one embodiment, the second communication port 242 may include an additional signal line (as compared to the first communication port 232), and the connector 240 and/or its bus 241 support the presence of the additional signal line.

In one embodiment, interface module 220 is comprised of logic and/or an integrated circuit package or substrate that interfaces each data bus 231, 241 to the memory module 210. Some or all of the same circuits and/or logic may be used to interface connections made through each data bus 231, 241 to the memory module 210. The connections made through either of the first or second connector 230, 240 may appear the same to the interface module 220. According to an embodiment, each connector 230, 240 may include contact elements that form a pin layout, and the pin layout of each connector 230, 240 may include a number of pin assignments that are the same. The second connector 240, however, may include an additional pin or pins that are not included on the first connector 230. In order to maintain identical (or substantially common) circuits and logic on the interface module 220 for use on each connector 230, 240, one or more embodiments assume values for pins that are present on the second connector 240 and not the first connector 230. For example, an additional pin that is present on the second connector 240 may be floated or grounded. The communication port 242 connected to that connector is provided the value of the grounded or floating signal pin. In this way, the signal line that extends from the additional pin of the second connector 240 may be excluded from the data bus 241 that extends to the interface module 220. The device 200 itself is configured or structured to behave in a manner that assumes the value of the floated or grounded pin when the second connector 240 is in use. For example, the extra pin of the second communication port 242 may be used to determine whether computing system 244 is to be host or client, and the value assigned to the grounded or floated pin sets the computing system 244 to be the host.

Under an embodiment in which the device 200 implements the USB standard, the variation between the first connector 230 and the second connector 240 may be that one interface accommodates a 5-pin layout, while the other connector 230 accommodates a 4-pin layout of a common standard. For example, the first connector 230 may provide for Type A receptacle connectors for the USB 2.0 standard, while the second connector 240 may accommodate Type A/B plug connectors under the same standard (for implementing On-the-Go variations of the same standard). The additional pin on the second connector 240 may be specified on the communication port 242 to designate the computing system 244 a host or a client, depending on the type of the device that is mated to the communication port. In the case of device 200, the value can be assumed by the interface module 220, since device 200 will always be a client. In contrast, the 4-pin layout of the communication port 232 only provides for the computing system 234 to be a host computer.

When device 200 is connected to a given computing system, the device 200 may signal an identification or other data from which the connected computing system is able to determine a function. Logic provided on each computing system 234, 244 (or distributed onto the device 200) may assign a default function to the device when the identification or other data from the device is received. In one embodiment, a logic 237 for invoking or associating a default functionality 235 to the device 200 on the first computing system 234 resides primarily on the first computing device. In one implementation, logic 237 may be in the form of software (e.g. File Folder Manager). In alternative embodiments, portions of the logic 237 may reside on the device 200. Likewise, a logic 247 for invoking or associating a default functionality 245 to the second computing system 244 resides primarily on the second computing device, in the form of software, and connectivity logic resides with the device 200. Other variations may provide for more sophisticated programming or logic to reside on the device 200, or shared between the device and the connected computing system 234, 244.

In one embodiment, the default function 235, 245 assigned by respective logic 237, 247 may be similar or the same. For example, the memory module 210 may include a Flash Memory component and a memory controller. A FAT File system may be implemented for reading data from and writing data to the Flash Memory component. In such an implementation, the functionality provided by the memory module 210 is auxiliary or accessory memory.

As described with, for example, an embodiment of FIG. 1, device 200 may be configured to trigger or otherwise cause an alternative or dual functionality to be assigned or otherwise associated with the device when it is connected to either computing system 234, 244. In one embodiment, device 200 includes a switch 250 that can be operated by a user. When operated, the switch 250 causes the device to signal an interrupt, or high priority data, that is detected by the connected computing system 234, 244. The data may be effective on one or both computing systems 234, 244. In one embodiment, the trigger data causes the connected computing system 234, 244 to identify the device 200 as having an alternative function. The alternative function may be implemented automatically or programmatically (with some user-interaction).

Numerous alternative functionality may be provided when the device's functionality is switched. In one embodiment, the device 200 operations are minimally altered, if at all, but the manner in which the connected host computing system 234, 244 utilizes the memory module 210 (using programming or other logic provided on the connected host computer) is altered based on the alternative functionality. While the default function may correspond to a file management system, alternative functionality supported, enabled, or otherwise provided by the device 200 may correspond to any one of (i) programmatic backup process of data files on the connected host computing system 234, 244 to the memory module 210, and/or (ii) selective file synchronization between a select set of files or folders on the connected host computing system 234, 244 and the files stored or structured onto the memory module 210.

In one embodiment, the alternative functionality that is enabled, provided, or otherwise supported by the device 200 may be specific to logic executed on the particular computing system 234, 244 that is connected to the device. Thus, if the second computing system 244 is a desktop and it is connected to device 200, the alternative functionality may correspond to, for example, file synchronization between folders stored on the memory module and folders stored on the second computing system 244. If, on the other hand, the first computing system 234 is connected to the device 200 and it corresponds to a mobile device (e.g. cellular telephony and messaging), the alternative function 236 on that device may enable automatic and programmatic archiving or data backup using the memory component. Both alternative functions 236, 246 may be supported on the device 200, depending on the type of computing system 234, 244 that is connected to the device 200. In one implementation, the alternative functions are in the form of applications or programs that launch in response to a trigger from the switch mechanism.

Thus, in addition to default function 235, 245, one or both logic 237, 247 may provide alternative functions 236, 246 for each computing device. In one embodiment, the logic 237 provided or shared with first computing system 234 enables that computing device to execute programming corresponding to the alternative function 236. Likewise, the logic 247 provided or shared with the second computing system 244 enables that computing device to execute programming corresponding to the alternative function 246. The alternative function 236, 246 on each computing system 234, 244 may be the same or different. Still further, only one of the two computing devices 234, 244 may have an alternative function.

According to one embodiment, when the device 200 is connected to either the first or second computing system 234, 244, the logic 237, 247 provides that the device 200 is assigned the default function 235, 245. The specific function assigned depends on design, and perhaps the computing system 234, 244 to which the device 200 is connected. The switch mechanism 250 may be operated by the user to switch the function assignment of the device 200 with the connected computing system 234, 244 (only one device is connected) to the alternative function 236, 246 (depending on which device is connected), whatever that function may be on the computing device. In one embodiment, the switch mechanism 250 generates an interrupt signal that is communicated to the computing system 234, 244 that is connected. This signal triggers the logic 237, 247 (depending on which device is connected) to switch the functionality from the default function 235, 245 to the alternative function 236, 246.

In one embodiment, the interrupt signal may be enumerated as a Human Interface Device (HID) input, such as a key stroke. When the input is received, the programming corresponding to the logic 237 (for the first computing system 234, if connected) or the logic 247 (for the second computing system 244, if connected) switches the function that is implemented (i.e. default function 235, 245) by running alternative routines and programs.

USB Type Accessory Device

Figure 3:
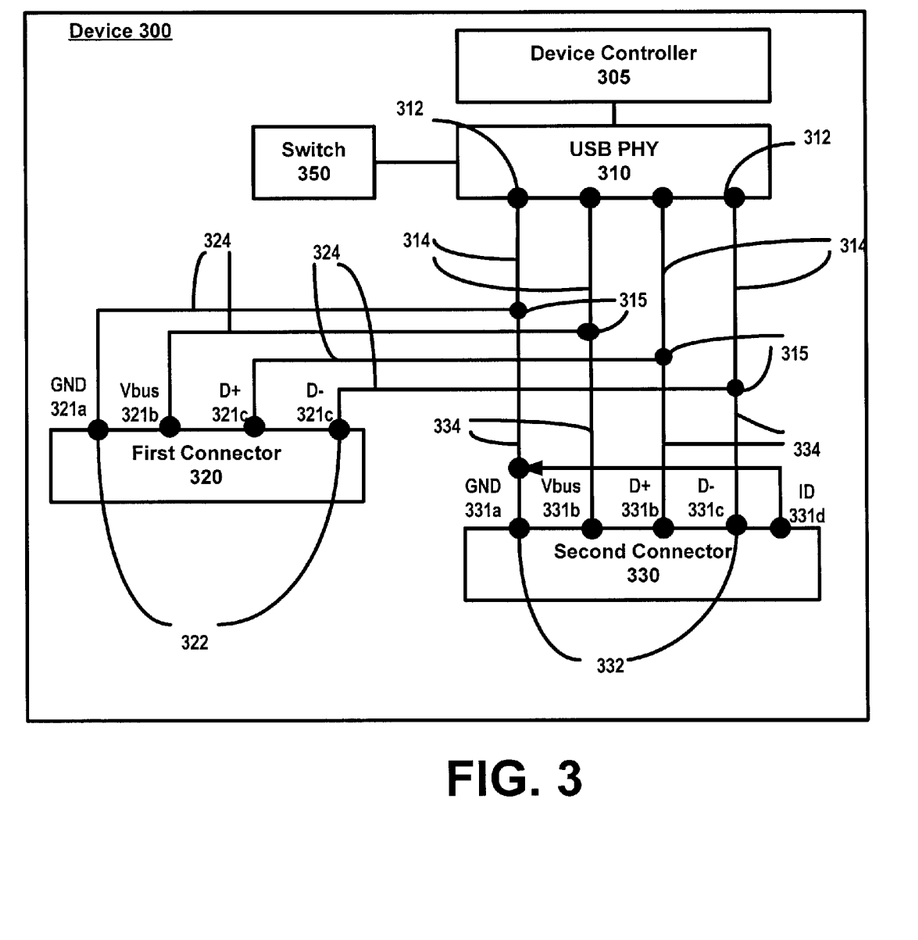
FIG. 3 illustrates a signal path and pin layout for a USB type accessory device that can be connected to a host computer through one of two possible connector interfaces, according to an embodiment.

FIG. 3 illustrates a signal path and pin layout for a USB type accessory device that can be connected to a host computer through one of two possible connector interfaces, according to an embodiment. A device 300 such as shown and described may be implemented for an embodiment such as described with FIG. 1 or with FIG. 2. As a USB type device, the interface module corresponds to the USB physical interface ("PHY") 310. In one implementation, the PHY 310 provides a data interface to a device controller 305, although other resources are contemplated with an embodiment such as shown by FIG. 3. The device controller 305 may include functionality to serve as a memory controller and USB controller. Each interface corresponds to a plug connector 320, 330, structured under the USB 2.0 standard. The first plug connector 320 may include 4 pins 322, with corresponding signal paths 324 that extend to the PHY 310. The second plug connector 330 may include 5 pins 332, with corresponding signal paths 324. The form factor of the first connector 320 and the second connector 330 may differ in accordance with the specifications of the USB 2.0 standard. In an implementation shown by FIG. 3, the first connector 320 may be used for Type A USB 2.0 communication ports, while the second connector 330 may be used for Type A/B USB 2.0 communication ports, such as Mini or MicroUSB connectors. The latter type of communication ports are often found on computing devices that are of the "On-The-Go" variety, or alternatively, small form-factor devices such as mobile device managers for cellular telephony and messaging. Moreover, the USB standard contemplates smaller form factors in the future, of which it is contemplated the use of 5 or more pins.

Device 300 may include a single PHY 310 for use with both connectors 320, 330. The PHY 310 may be provided in the form of a chip, or other silicon package that is structured in accordance with the appropriate USB 2.0 standards. According to an embodiment, the single PHY 310 may be used to support data exchange and communications across either connector 320, 330, even though the connectors have different pin layouts, and are used with communication ports that execute different variations of the USB protocols.

In one embodiment, the PHY 310 includes pins 312 of a number that is the same as the pins of the first connector 320. Signal paths 314 from pins 312 may extend to junctures 315 where signal paths 324 of the first connector 320 and signal paths 334 of the second connector 330 join. Since the PHY 310 has only 4 pins, the additional pin from the second connector 330 may be tied to float or ground. When the second connector 330 is used, the communication port that connects to that connector may assume a value from the tied pin floating or being grounded.

Under the USB standards, the pin layout for the first connector 320 provides for a ground pin 321a, a Vbus pin 321b, and a pair of data pins (D+ and D−) 321c (collectively the pins 322). These assignments are extended to the signal paths 324, junctures 315 and to the signal paths 314 that extend to PHY 310. The pin layout for the second connector 330 provides for a ground pin 331a, a Vbus pin 331b, a pair of data pints (D+ and D−) 331c, and an identity pin 331d (collectively the pins 332). The assignment of the pins of the second connector 330 extends to the signal paths 334. In this way, the second connector 330 includes the same pin assignments as the first connector 320, except for the addition of the identity pin 331d. Under the relevant USB standards (e.g. "On-the-Go"), the identity pin 331 is used to establish which of the connected devices in a pair are to act as host. The identity pin 331 may be floated or grounded when extended into the signal path 335, so that is not extended to the PHY 310. If a computing device connects to the second connector 330, the computing device detects the signal from the grounded identity pin 331d and assumes the device 300 is to be the client, and the computing device is to be the host. In this way, the signal paths 334 of the remaining pins 332 of the second connector 330 may be extended via junctures 315 so as to merge or combine with the signal paths 324 of the first connector 320, and form the signal paths 314 that connect to the pins 312 of the PHY 310. As such, both the first and second connectors 320 and 330 use the signal paths 314 and thus appear the same to the PHY 310. The identity pin 331d which is present with the second connector 330 is provided a designated value that assumes device 300 is to always serve as the client. In one embodiment, the PHY 310 may use the exact same circuits and/or logic to interface a connected computing device through either the first connector 320 or the second connector 330 with the device controller 305.

In an embodiment, a switch mechanism 350 may be incorporated or connected to the PHY 310. The switch mechanism 350 may be manually operated to trigger an interrupt event. Under the USB standard, the interrupt event may result in the PHY 310 generating high priority data that is polled by the connected computing device. Prior to the switch mechanism 350 being actuated, the PHY 310 may generate an identifier or other data that signals a first (or default) function to the connected computing device. This first function is performed primarily through software or other programming on the connected computer. After actuation, another signal (the interrupt signal) may trigger alternative functionality to be assigned to the device 300 on the connected computing device. This alternative functionality may be implemented programmatically and/or automatically on the connected computing device. Both identification signals may be communicated using one or both the data lines (D+ and D−).

As described with one or more other embodiments, the default functionality assigned to device 300 may be a file manager, to enable a user of the computing device 300 to browse and select files stored on the device 300, as well as to write data to the device 300, and to retrieve data form the device. Once the interrupt is generated, the functionality may be switched on the computing device to one or both of (i) performing a backup or archival process, or (ii) performing a file synchronization process with select files stored on the device 300. Numerous other variations and alternatives are also contemplated.

Housing Construction Examples and Details

Figure 4:
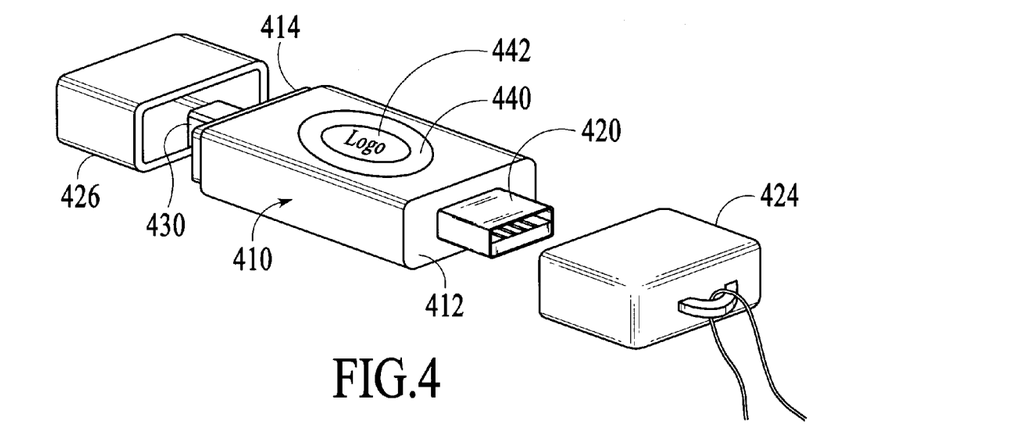
FIG. 4 illustrates an accessory device constructed under any one or more of the embodiments described herein.

FIG. 4 illustrates an accessory device constructed under any one or more of the embodiments described herein. In an embodiment, an electronic accessory device 400 for host computers includes a housing 410 having a first end 412 and a second end 414. A first connector 420 extends from the first end 412, and a second connector 430 extends from the second end 414. The first connector 420 may be different from the second connector because of any one or more of the following characteristics: (i) form factor, in that first connector 420 may be larger than the second connector 430; (ii) pin or contact element layout, in which, for example, the first connector 420 has 4 pins and the second connector 430 has 5 pins. According to one embodiment, the first connector 420 is a USB Type A plug connector, while the second connector is a Mini or Micro-USB Type A/B plug connector. Still further, embodiments described herein may extend to future form factors and connector types contemplated by the USB standard, such as the so-called Micro-USB connector (which may include 4 or 5 pins and have a smaller form factor than the Mini or Micro-USB type).

In an embodiment, housing 410 includes a switch mechanism provided in the form of a push button 440 (or other actuation type mechanisms). As described with one or more other embodiments, actuation of the push button 440 causes the device 400 to signal an identification, enumeration or other input to the connected host computer (not shown) so as to cause the connected host computer to associate or invoke an alternative functionality for use with the device 400.

In an embodiment, the push button 440 includes a logo 442 or brand area. For example, the logo 442 may identify one or more of a manufacturer who produces or is associated with the device 400 or one of the host computers that the device is to connect to. Other logos, messages or even advertisements may be provided in the branded area of the logo 442.

The following provides an example of how the device 400 may be implemented and used, under one or more embodiments described herein. In one implementation, the housing 410 may contain Flash memory as its resource, and the device 400 may carry files and other data for use with other computers that it can connect with. The first connector 420 (USB Type A) may be used to connect the device 400 to corresponding USB receptacles that are typically included on personal computers (e.g. desktop or laptops), although other suitably equipped devices may also be used. When the first connector 420 is used, the connected computer must be a host under the data exchange protocol implemented with the USB standard. In one embodiment, the device 400 can be used with this kind of host computer to have more than one type of function. A default or normal function associated with the device 400 is file storage, readable using a standard file explorer program on the host computer. In one embodiment, actuation of the push button 440 causes internal logic (such as may be associated with either the PHY or the memory controller) to communicate a Human Input Device (HID) command that is in accordance with the USB standard. A program or combination of programs on the host computer (e.g. driver and application for device 400) may then associate an alternative set of functions with the device 400. For example, an application pre-associated with the device 400 may be triggered to perform an operation where one or more of a file viewer and/or manager, synchronization or file backup either takes place automatically (in response to the push button 440 being triggered, or is otherwise enabled with further user-interaction.

As an alternative to using the first connector 420, second connector 430 (USB Type A/B) may be used to connect the device 400 to corresponding USB receptacles that are typically included on small form-factor devices, such as cellular devices (for telephony and/or messaging), media players, Global Positioning System devices, cameras, or combination devices thereof. Such devices often have the ability to be either host or client when receiving connected devices on their USB A/B receptacles, depending on the device that is making the connection. Whether this type of computing device becomes a host depends on the result of the handshaking or other transaction protocol that takes place when it receives a connected device on its Type A/B receptacle. In an embodiment such as described with FIG. 3 (or elsewhere in this application), the computing device that receives device 400 via second connector 430 recognizes the device 400 as the client. As described with FIG. 3, this result may be achieved by structuring the pin or contact elements, or the bus extending therefrom, of the second connector 430. This structuring results in the computing device connected to the second connector 430 receiving a signal from the identity pin of second connector 430 which has a value (float or ground) that is indicative of device 400 being the client.

As with the case of the connection made through the first connector 420, the device 400 may have an association with applications and other programming on the computing device connected through the second connector 430. As such, the device 400 may have multiple, alternative functions associated with it on the second computer 430. For example, in a default mode, the device 400 may store files and have a Flash memory component accessible to the host computer through a file manager program. When push button 440 is actuate, the device 400 sends the HID (or alternative signal) to the computing device so as to have an alternative program, application and/or function associated with it.

In one implementation, for example, when the push button 440 is triggered for the computing device connected to the second connector 430 (e.g. the Type A/B connector), the connected computing device may perform a file backup or archival using the memory component of the device 400. When the push button 440 is triggered for the computing device connected to the first connector 420 (e.g. the Type A connector), the connected computing device may perform or enable a selective synchronization process between one or more folders on the connected computer and one or more folders on the memory component of the device 400.

In an alternative or additional embodiment, one of the programs on either computing device that may be pre-associated with the device 400 enables enable on-the-fly synchronization between the device 400 and the connected computing device. In such an embodiment, when a file or folder on the connected computing device is updated or modified, a corresponding file or folder on the device 400 is synchronized while the device 400 is connected.

In an embodiment such as described with, for example, FIG. 3, each of the first and second connectors 420 and 430 share a portion of a bus line that extends to the physical interface (not shown) and/or controller (not shown) of the device 400. In an embodiment, the device 400 may be configured to only allow connectivity to one of its two connectors, to avoid device malfunction as a result of two computing devices using the same portion of the bus line. In an implementation such as shown by FIG. 4, one or more caps 424, 426 may be used to protect each connector 4320, 430 when that connector is not in use. One cap 424 may, for example, include a neck chain or other mechanism to enable carriage by the user.

Figure 5A:
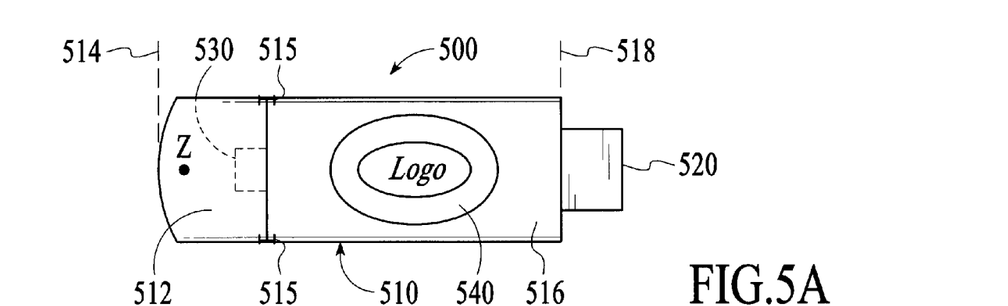
FIG. 5A and FIG. 5B illustrate a construction for a device in which the device is limited to using only of two possible connectors, according to an embodiment to of the invention.
Figure 5B:
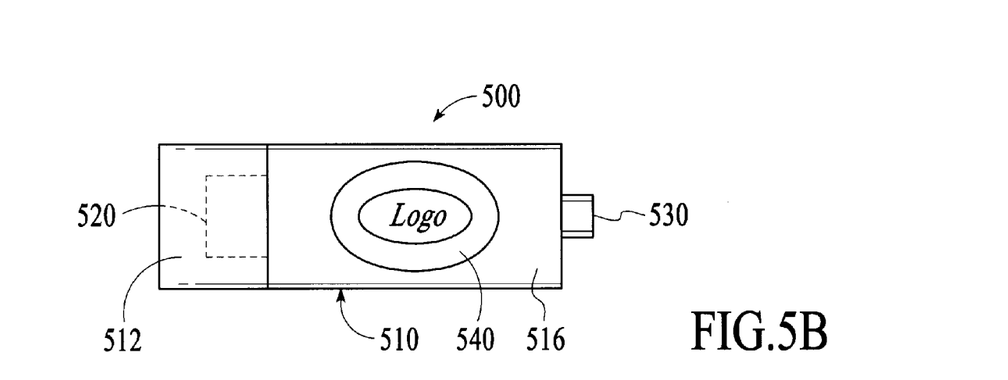

FIG. 5A and FIG. 5B illustrate a construction for a device in which the device is limited to using only of two possible connectors, according to an embodiment to of the invention. An embodiment of FIG. 5A and FIG. 5B may be similar to an embodiment of FIG. 4, in that a device 500 may be of a USB type, and carry a first connector 520 that is of a first kind (e.g. USB Type A plug connector), and a second connector 530 that is of a second kind (e.g. USB Type A/B plug connector). The device 500 may provide electronic accessory functions, such as a Flash memory. A housing 510 of device 500 may be segmented about a pivot 515 that defines a first portion 512 and a second portion 516. The first housing portion 512 may extend from the pivot 515 to a first end reference 514. The second portion 516 may extend from the pivot 515 to the second end reference 518.

The pivot 515 may be constructed to enable the second housing portion 516 to swivel 180 or 360 degrees, about a Z axis (shown to extend into the paper). Each swivel of the second housing portion 516 may cause one of the two connectors to be removed from containment in the first housing portion 512 and another of the two connectors to be moved into containment with the first housing portion 512. In order to enable movement of the connectors into and out of the first housing portion 512, the first housing portion 512 and/or pivot 515 may be structured to provide lateral separation and closure with swivel movement of the second housing portion 518. For example, the pivot 515 may include a hinge element that enables the first housing portion 512 to breakaway while remaining connected. While the first housing portion 512 is separated, the second housing portion 516 may be swiveled, to allow one connector to be switched in position by the other. Then the first housing portion 512 may be moved into the second housing portion 516 to snap shut.

In one implementation, both the first connector 520 and the second connector 530 are positioned on the second housing portion 516. The internal components of the device 500 carrying the physical interface (not shown in FIG. 5) and/or memory component (not shown in FIG. 5) may also be contained on the second housing portion 516. The first housing portion 512 may be hollowed.

In FIG. 5A, device 500 is in a first position for engaging a host computer using first connector 520. In this position, first connector 520 extends unobstructed from the second housing portion 516. The second connector 530 may extend from the second housing portion 518 into the receptacle of the first housing portion 512, across a reference of the pivot 515. In this way, the first housing portion 512 forms a cap that precludes the use of the second connector 530, when the first connector 520 is in a position of use.

FIG. 5B illustrates the case where the user swivels the second housing portion 180 degrees to switch the position of the first connector 520 and the second connector. The second connector 530 may be exposed for use, while the first connector 520 is precluded from use by the first housing segment 512. In this way, the second connector 530 may be used while the first connector 520 cannot be used.

As with an embodiment of FIG. 4, a push button 540 or other switch mechanism may be provided to enable a user to trigger an alternative functionality for use of the device 500 on the connected host computer.

Figure 6A:
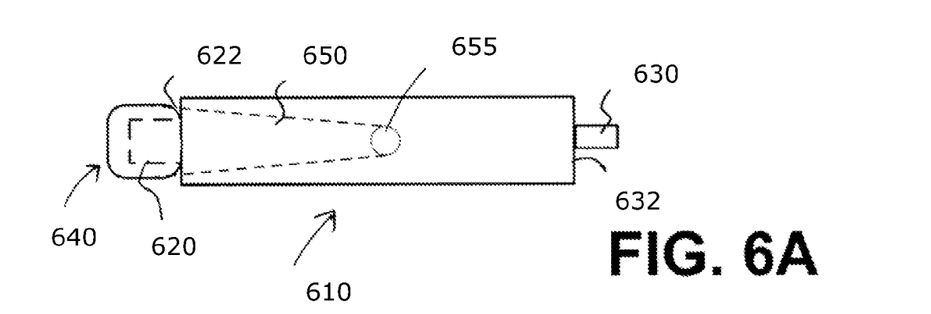
FIG. 6A and FIG. 6B illustrate another construction for a device in which the device includes a moveable cap, according to an embodiment to of the invention.
Figure 6B:
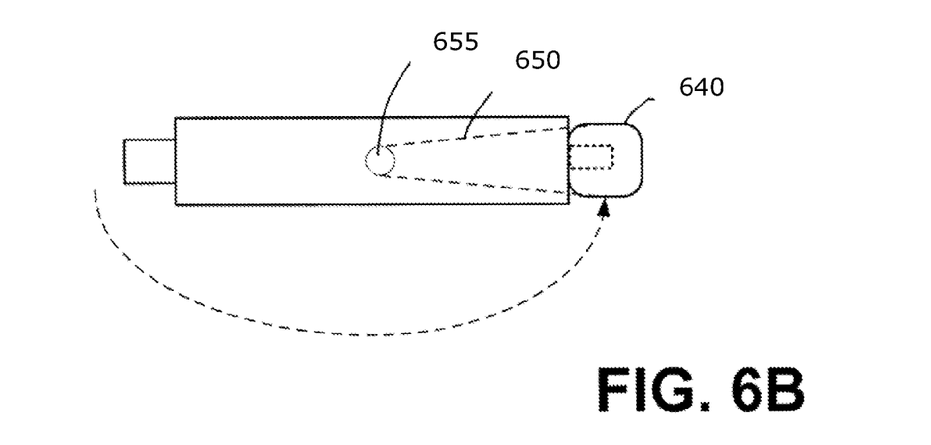

While an embodiment of FIG. 5A and FIG. 5B illustrate use of a swivel, other mechanisms and means may also be used to preclude or mechanically dissuade use of both connectors at one time. For example, an attached cover my be used that may be snapped over the connector not in use. The user may be incentavized to use the cover, as its not use extends the cover orthogonally to the body of the device. As another alternative, the direction of the swivel may be about another axis perpendicular to the Z-axis. Numerous other alternatives exist. FIG. 6A and FIG. 6B illustrate another construction for a device in which the device includes a moveable cap, according to an embodiment to of the invention. A device 610 may be configured according to any of the embodiments described with FIG. 1-4, with one or the other connector 620, 630 can be used at one time. In one embodiment, a cap 640 may be positionable on either end 622, 632 of the device, so as to cover a corresponding one of the connectors 620, 630. In order to move the cap 640, an arm 650 may couple to a pivot 655 or joint to enable the cap to swing from overlaying one connector 620 to another 630. Detents or structures may be provided at each end 622, 632 to assist the cap 640 to stay in place. In order to cover the connectors 620, 630, the cap 640 may include an additional pivot element to enable it to be placed over the respective connector.

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mention of the particular feature. Thus, the absence of describing combinations should not preclude the inventor from claiming rights to such combinations.

The invention claimed is:

1. An electronic accessory device for attachment and use with a computing system, the electronic device comprising:
    a housing including a first end and a second end opposing the first end;
    a first plug connector extended from the first end of the housing, wherein the first plug connector (i) has a first form factor, (ii) is matable with a first type of communication port, and (iii) includes a first set of contact elements;
    a second plug connector extended from the second end of the housing so as to extend in an opposite direction from the first plug connector, wherein the second plug connector (i) has a second form factor, (ii) is matable with a second type of communication port, and (iii) includes a second set of contact elements;
    a data resource provided within the housing;
    an integrated circuit component;
    a plurality of signal lines that extend from each of the first and second set of contact elements to the integrated circuit component, wherein the first and second set of contact elements share at least some of the plurality of signal lines that connect to the integrated circuit component; and
    wherein the integrated circuit component enables (i) a first computing system having the first communication port to access and use the data resource through the first plug connector and at least a first portion of the plurality of signal lines, and (ii) a second computing system having the second communication port to access and use the data resource through the second plug connector and at least a second portion of the plurality of signal lines.

2. The device of claim 1, wherein the device enables only one of the first computing system or the second computing system to access the data resource at one time.

3. The device of claim 2, wherein the device is physically structured to enable only one of the first computing system to be connected to the first plug connector or the second computing system to be connected to the second plug connector.

4. The device of claim 1, wherein the first plug connector is a first kind of Universal Serial Bus connector having a first number of contact elements, and wherein the second plug connector is a second kind of Universal Serial Bus connector having a second number of contact elements that is different than the first number of contact elements.

5. The device of claim 4, wherein the first plug connector is a Universal Serial Bus Series A connector plug, and the second plug connector is a Universal Serial Bus Series A/B connector plug.

6. The device of claim 1, wherein the second set of contact elements of the second plug connector includes at least one additional contact element as compared to the first set of contact elements of the first plug connector, and wherein a signal line of the additional contact element is tied, or combined with one of the plurality of signal lines, so as to not extend to the integrated circuit component.

7. The device of claim 6, wherein the signal line of the additional contact element is tied or combined to provide a value to the second computing system when the second computing system is connected to the device, so that the second computing system receives a designated value.

8. The device of claim 7, wherein the communication port of the computing system enables the computing system to be either a host or a client, and wherein the value provided by the signal line of the additional contact element designates the device to be the client, and the second computing system connected to the second plug connector to be the host.

9. The device of claim 8, wherein (i) the first set of contact elements of the first plug connector includes a contact element designated for each of voltage, a ground, and a pair of data lines, and (ii) the second set of contact elements of the second plug connector includes a contact element designated for each of a voltage, a ground, a pair of data lines, and an identity signal; and
wherein at least one of the contact elements for the identity signal or another portion of the identity signal is tied or combined with one of the contact elements, or a signal line to one of the second set of contact elements.

10. The device of claim 9, wherein the integrated circuit component, the first plug connector, and the second plug connector are structured in accordance with a Universal Serial Bus standard.

11. The device of claim 1, wherein the integrated circuit component is provided on a single chip.

12. The device of claim 1, further comprising a switch component, wherein the switch component is configured to trigger a signal from the device, wherein the trigger signal is communicated, using one or more of the plurality of the signal lines, to one of a first computing system connected to the device through the first plug connector or a second computing system connected to the device through the second plug connector.

13. A system for exchanging data, the system comprising:
(a) a device comprising:
a housing including a first end and a second end that opposes the first end;
a first plug connector extended from the first end of the housing, wherein the first plug connector (i) has a first form factor, (ii) is matable with a first type of communication port, and (iii) includes a first set of contact elements;
a second plug connector extended from the second end of the housing so as to extend in an opposite direction from the first plug connector, wherein the second plug connector (i) has a second form factor, (ii) is matable with a second type of communication port, and (iii) includes a second set of contact elements;
a data resource provided within the housing;
an integrated circuit component;
a plurality of signal lines that extend from each of the first and second set of contact elements to the integrated circuit component, wherein the first and second set of contact elements share at least some of the plurality of signal lines that connect to the integrated circuit component; and
wherein the integrated circuit component enables (i) a first computing system having the first communication port to access and use the data resource through the first plug connector and at least a first portion of the plurality of signal lines, and (ii) a second computing system having the second communication port to access and use the data resource through the second plug connector and at least a second portion of the plurality of signal lines;
(b) a computer connected to the electronic device through either (i) the first plug connector so as to be the first computing system, or (ii) the second plug connector so as to be the second computing system, wherein the connected computer comprises:
logic that is invoked or used with the device, wherein the logic causes the computer to perform one or more functions when connected to the device.

14. The system of claim 13, wherein the device used as only a client by either of the first computing system or the second computing system.

15. The system of claim 13,
wherein the device further comprises:
a switch component, wherein the switch component is configured to trigger a signal to the connected computer, and
wherein the logic of the computer includes a first program that recognizes a first set of functions to be performed using the device and a second program that recognizes a second set of functions to be performed using the device;
wherein prior to the signal being triggered from the switch component, the computer uses the first program to enable or perform the first set of functions using the device; and
wherein the signal triggered from the switch component causes the computer to execute the second program over the first program in order to enable or perform the second set of functions instead of the first set of functions.

16. The system of claim 15, wherein the first set of functions includes enabling or automatically executing a file management program to enable a user to view and access files from the data resource of the device.

17. The system of claim 16, wherein the second set of functions include a function or set of functions selected for performing one or more of (i) a file synchronization process between one or more files stored on the device and one or more files stored on the computer, and (ii) a backup process to store one or more files from the computer onto the device.

18. The system of claim 15, wherein the second set of contact elements of the second plug connector includes at least one additional contact element as compared to the first set of contact elements of the first plug connector, and wherein a signal line of the additional contact element is tied or combined with one of the plurality of signal lines so as to not extend to the integrated circuit component.

19. The system of claim 18, wherein the signal line of the additional contact element is tied or combined to provide a value, so that the computer connected through the second plug connector detects a designated value.

20. The device of claim 19, wherein the communication port of the connected computer enables the connected computer to be either a host or a client, and wherein the value provided by the signal line of the additional contact element being tied or combined designates the device to be the client, and the connected computer implements a data exchange protocol with the device as a host.

21. The system of claim 13, wherein the device is enables only one of the first computing system or the second computing system to access the data resource at one time.

22. The system of claim 13, wherein the first plug connector is a first kind of Universal Serial Bus connector having a first number of contact elements, and wherein the second plug connector is a second kind of Universal Serial Bus connector having a second number of contact elements that is different than the first number of contact elements.

* * * * *